United States Patent [19]

Jun

[11] Patent Number: 5,561,327
[45] Date of Patent: Oct. 1, 1996

[54] MULTILAYER INTERCONNECTION STRUCTURE FOR A SEMICONDUCTOR DEVICE

[75] Inventor: Young K. Jun, Seoul, Rep. of Korea

[73] Assignee: LG Semicon Co., Ltd., Seoul, Rep. of Korea

[21] Appl. No.: 526,134

[22] Filed: Sep. 5, 1995

Related U.S. Application Data

[63] Continuation of Ser. No. 311,906, Sep. 26, 1994, abandoned, which is a continuation of Ser. No. 109,161, Aug. 19, 1993, abandoned.

[51] Int. Cl.$^6$ ................................................. H01L 23/48
[52] U.S. Cl. .................... 257/758; 257/773; 257/774; 257/775; 257/776
[58] Field of Search .............................. 257/774, 775, 257/773, 776, 758

[56] References Cited

U.S. PATENT DOCUMENTS

| | | | |
|---|---|---|---|
| 4,587,549 | 5/1986 | Ushiku | 357/71 |
| 4,656,732 | 4/1987 | Teng et al. | 29/891 |
| 4,716,452 | 12/1987 | Kondoh et al. | 257/776 |
| 4,916,521 | 4/1990 | Yoshikawa et al. | 257/774 |

Primary Examiner—Jerome Jackson, Jr.
Assistant Examiner—Nathan K. Kelley
Attorney, Agent, or Firm—Morgan, Lewis and Bockius LLP

[57] ABSTRACT

A multilayer interconnection structure for a semiconductor device improving the integration degree of the semiconductor device and reducing the contact resistance. This interconnection structure comprises a lower interconnection layer having a predetermined constant width, an insulating layer provided on the lower interconnection layer and having a contact hole which is vertically placed on the lower interconnection layer and has a width larger than that of the lower interconnection layer, and an upper interconnection layer laid on the insulating layer such that it is connected to the lower interconnection layer through the contact hole. The upper interconnection layer has an enlarged portion at each side of or at only a side of its section corresponding to the contact hole. The enlarged portion extends toward a longitudinal direction of the lower interconnection layer.

3 Claims, 7 Drawing Sheets

MULTILAYER INTERCONNECTION STRUCTURE FOR A SEMICONDUCTOR DEVICE

This application is a continuation of application Ser. No. 08/311,906, filed Sep. 26, 1994, now abandoned, which is a continuation of application Ser. No. 08/109,161, filed Aug. 19, 1993, now abandoned.

BACKGROUND OF THE INVENTION

FIELD OF THE INVENTION

The present invention relates in general to a multilayer interconnection structure for a semiconductor device, and more particularly to an improvement on a contact hole pattern as well as on a via hole pattern of the multilayer interconnection structure for the semiconductor device.

In a conventional multilayer interconnection structure for a semiconductor device having metal interconnection layers, a contact hole is formed at an intersecting section of the interconnection structure where an upper interconnection layer intersects a lower interconnection layer. In order to provide an enlarged contact area at the intersecting section, each of the interconnection layers is provided with an enlarged portion at its section corresponding to the contact hole for achieving a desired contact overlap.

Hereinbelow, a technique for preparing a known multilayer interconnection structure having a contact hole in conjunction with FIGS. 1 to 5.

Figure 1:
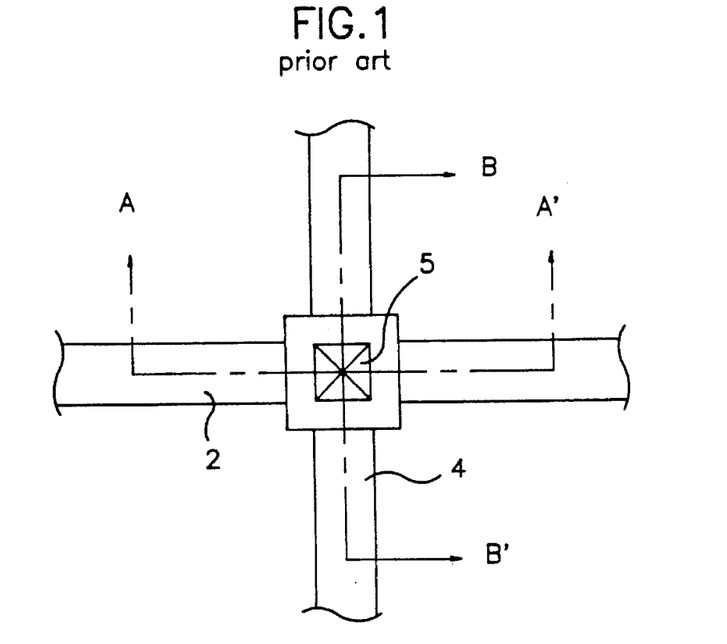
FIG. 1 is a plan view of a multilayer interconnection structure for a semiconductor device in accordance with an embodiment of the prior art.
Figure 2A:
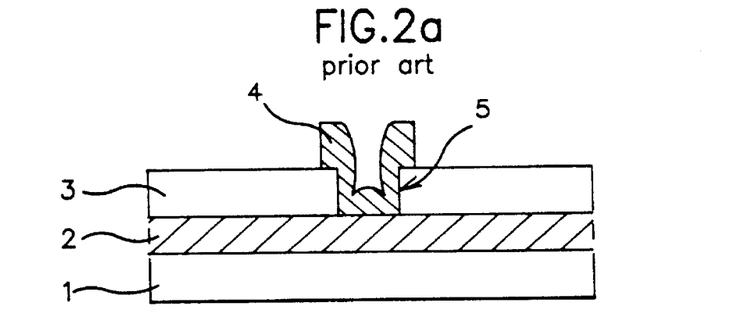
FIG. 2a is a sectional view taken along the section line A–A' of FIG. 1.
Figure 2B:
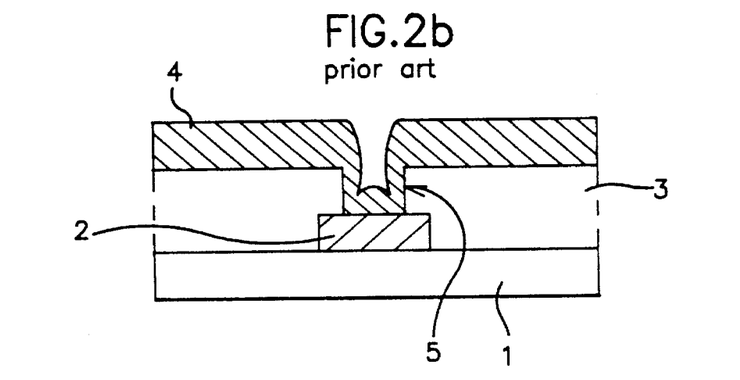
FIG. 2b is a sectional view taken along the section line B–B' of FIG. 1.

With reference to FIG. 1, 2a and 2b, FIG. 1 is a plan view showing an embodiment of a known multilayer interconnection structure for a semiconductor device, and FIGS. 2a and 2b are sectional views taken along the section lines A–A' and B–B' of FIG. 1, respectively.

As shown in these drawings, the known interconnection structure for the semiconductor device comprises a lower interconnection layer 2 and an upper interconnection layer 4 which intersect each other. At the intersecting section of the layers 2 and 4, the wiring structure includes a contact hole 5 for contacting the upper layer 4 with the lower layer 2. Each of the interconnection layers 2 and 4 is provided with an enlarged portion for providing a desired contact margin at the intersecting section. The width of the enlarged portion is larger than the other sections of the interconnection layers 2 and 4.

In order to prepare the contact hole 5, a lower insulating layer 1 is deposited on a semiconductor substrate and, thereafter, the lower interconnection layer 2 is laid on the lower insulating layer 1 by patterning.

The lower interconnection layer 2 is in turn completely coated with an upper insulating layer 3, so that it is insulated from the outside. A part of the upper insulating layer 3 is, thereafter, removed to expose a part of the lower interconnection layer 2 to the outside and to provide a space for the contact hole 5. After the contact hole 5 is formed on the exposed section of the lower interconnection layer 2, the upper interconnection layer 4 is laid on the contact hole 5 such that the upper interconnection layer 4 passes over the contact hole 5 and intersects and contacts with the lower interconnection layer 2.

Figure 3:
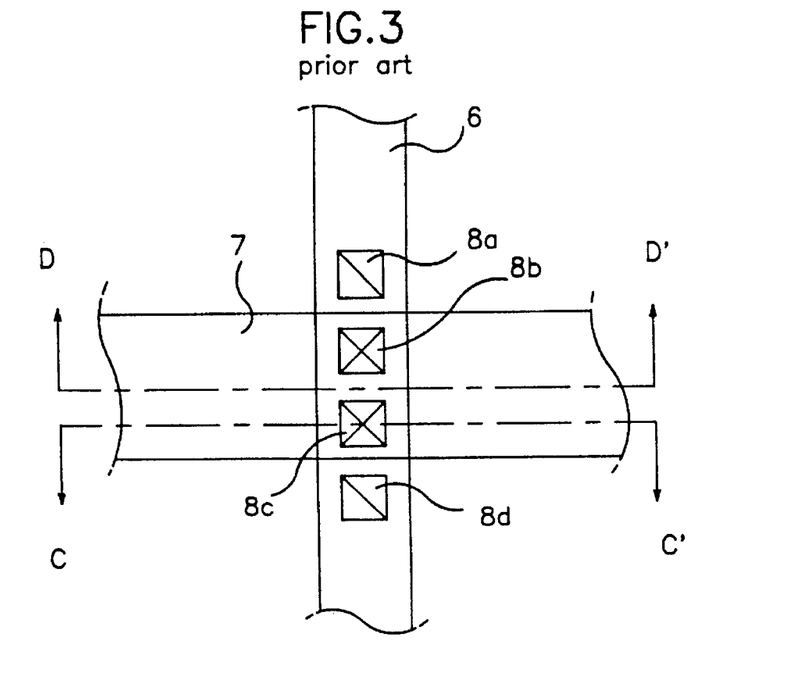
FIG. 3 is a plan view of a multilayer interconnection structure for a semiconductor device in accordance with another embodiment of the prior art.
Figure 4A:
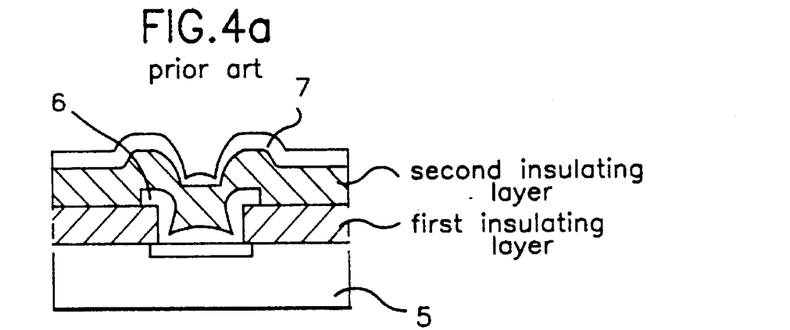
FIG. 4a is a sectional view taken along the section line C–C' of FIG. 3, especially showing a section of a interconnection structure having a drawback to be overcome by the interconnection structure of FIG. 3.
Figure 4B:
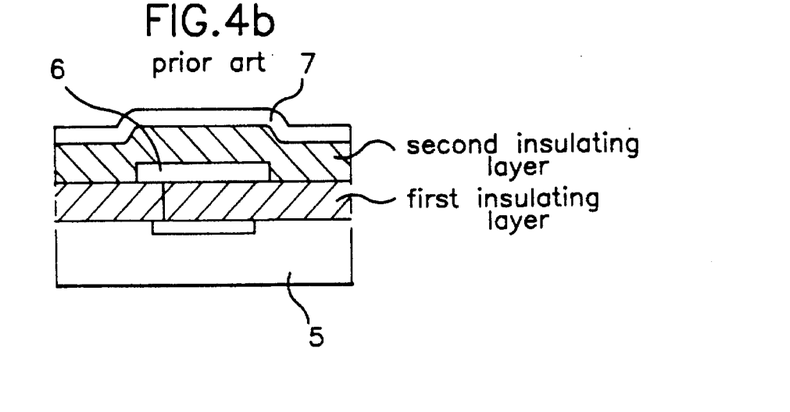
FIG. 4b is a sectional view taken along the section line D–D' of FIG. 3, especially showing a section of the interconnection structure of FIG. 3.

Turning to FIGS. 3, 4a and 4b, there are shown other embodiments of multilayer interconnection structures of semiconductor devices. These structures are disclosed in U.S. Pat. No. 4,587,549 (date of patent: Jun. 6, 1986, inventors: Yukihiro Ushiku and et al., and assignee: K.K. Toshiba, Japan). FIG. 3 is a plan view of the multilayer interconnection structure of this U.S. patent, and FIGS. 4a and 4b are sectional views taken along the section lines C–C' and D–D' of FIG. 3, respectively. Especially, FIG. 4a shows a section of a multilayer interconnection structure which has a drawback to be overcome by the interconnection structure of FIGS. 3 and 4b.

In a multilayer interconnection structure having the section shown in FIG. 4a, a first insulating layer is deposited on the surface of a semiconductor substrate 5. Thereafter, a lower interconnection layer 6 is laid on the surface of the first insulating layer to be connected to the semiconductor substrate 5 through a plurality of contact holes 8a, 8b, 8c and 8d. A second insulating layer is mounted on the first insulating layer and the lower interconnection layer 6. The interconnection structure also includes an upper interconnection layer 7 which is laid on the second insulating layer such that it intersects the lower interconnection layer 6 and is connected to the layer 6 by means of the contact holes 8b and 8c. In this interconnection structure shown in FIG. 4a, the upper interconnection layer 7 is partially thinner in a stepped portion which is defined by the contact holes, so that the upper interconnection layer 7 has a drawback that it is increased in its resistance and have less reliability. In order to overcome such a drawback, the U.S. Pat. No. 4,587,549 proposes a multilayer interconnection structure in which the contact holes 8b and 8c are placed in a region where the lower and upper interconnection layers 6 and 7 intersect each other, thereby letting the upper interconnection layer 7 have a portion which is not influenced by the profile of the contact holes as shown in the sectional view of FIG. 4b.

Figure 5:
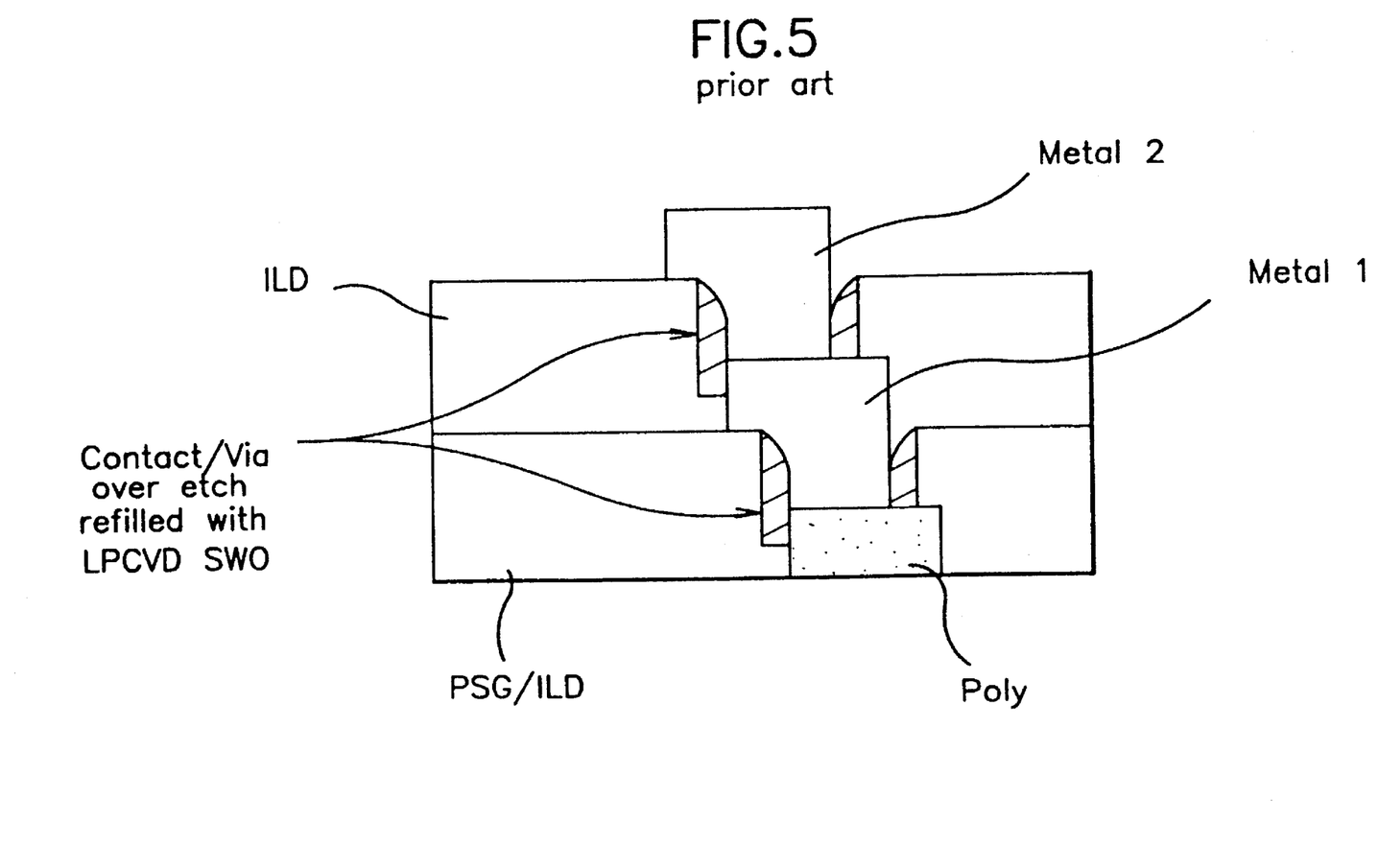
FIG. 5 is a sectional view of a multilayer interconnection structure for a semiconductor device in accordance with still another embodiment of the prior art.

With reference to FIG. 5, there is shown in a sectional view still another embodiment of a multilayer interconnection structure for a semiconductor device of the prior art. This structure is disclosed in U.S. Pat. No. 4,656,732 (date of patent: Apr. 14, 1987, inventors: Clarence W. Teng and et al., and assignee: Texas Instruments Incorporated).

The technique disclosed in U.S. Pat. No. 4,656,732 provides an integrated circuit wherein the width of contact holes is narrowed by a sidewall oxide, so that the metal interconnection layer can be patterned to minimum geometry everywhere and does not have to be widened where it runs over a contact hole.

However, the aforementioned embodiments of multilayer interconnection structures for a semiconductor device have the following drawbacks, respectively.

In the known multilayer interconnection structure shown in FIG. 4a, an enlarged portion should be provided at the intersecting section, where the upper interconnection layer 7 intersects the lower interconnection layer 6, in order to prevent a contact misalignment. Thus, this structure has a drawback that there is a limit in minimizing the interval between the interconnection layers 6 and 7 and, as a result, the recent trend of improved integration degree of the semiconductor device can not be achieved in this structure.

In the known structure shown in FIG. 4b and disclosed in U.S. Pat. No. 4,587,549, the upper and lower interconnection layers intersect each other above the contact holes, and the contact hole overlaps no part of the traverse region of the upper interconnection layer in the intersecting section. Thus, this structure somewhat improves the integration degree of the semiconductor device, however, the improvement of the integration degree of this structure is attended with reduction of the contact hole size, thereby introducing a drawback that the contact resistance is increased.

In the same manner, the multilayer interconnection structure disclosed in U.S. Pat. No. 4,656,732 somewhat improves the integration degree of the circuit since the width of the contact holes is narrowed by the sidewall oxide. However, this structure has a drawback caused by the reduction of the contact hole size. That is, the contact hole size of this structure is reduced in accordance with improvement of integration degree and this rapidly increases the contact resistance.

SUMMARY OF THE INVENTION

It is, therefore, an object of the present invention to provide a multilayer interconnection structure for a semiconductor device in which the aforementioned drawbacks can be overcome and which improves the integration degree of the semiconductor device while at the same time reducing the contact resistance by reducing the interval between the interconnection layers.

In order to accomplish the above object, the present invention provides a multilayer interconnection structure for a semiconductor device comprising upper and lower interconnection layers intersecting each other with an insulating layer interposed therebetween and connected to each other through a contact hole, wherein the contact hole covers at least a part of the outside section of the lower interconnection layer, and the upper interconnection layer has an enlarged portion at one or more surfaces of its intersecting section where it intersects the lower interconnection layer, but the lower interconnection layer has no enlarged portion.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 6:
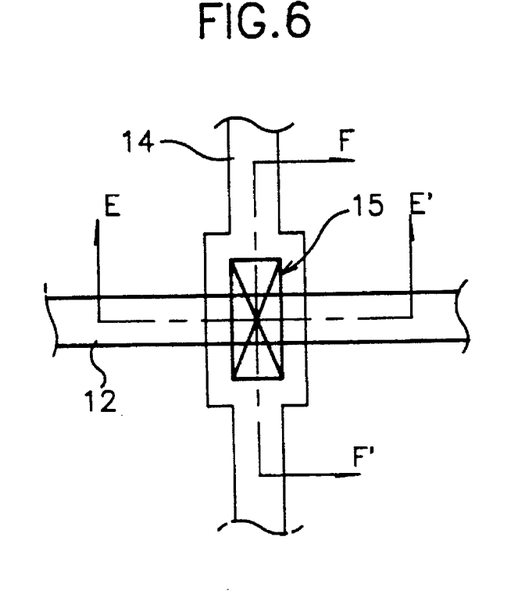
FIG. 6 is a plan view of a multilayer interconnection structure for a semiconductor device in accordance with a primary embodiment of the present invention.
Figure 7A:
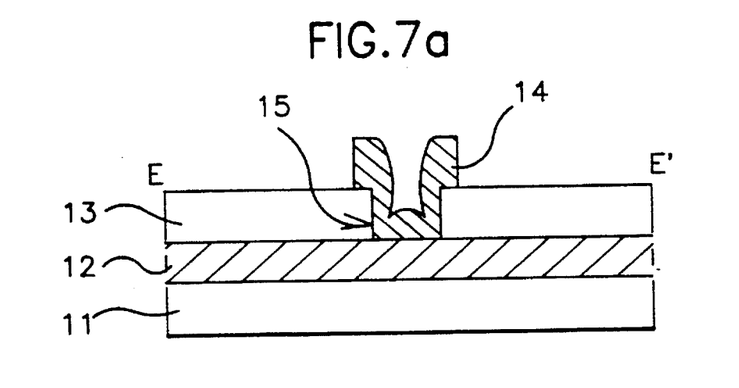
FIG. 7a is a sectional view of the primary embodiment taken along the section line E–E' of FIG. 6.
Figure 7B:
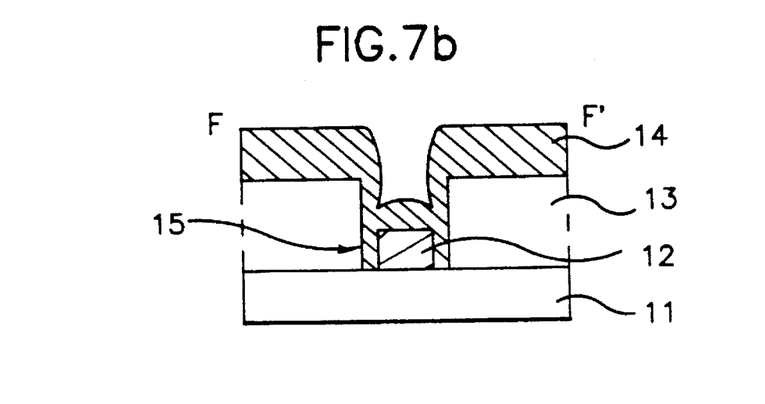
FIG. 7b is a sectional view of the primary embodiment taken along the section line F–F' of FIG. 6.

With reference to FIGS. 6, 7a and 7b, there is shown a multilayer interconnection structure for a semiconductor device in accordance with a primary embodiment of this invention. FIG. 6 is a plan view of the structure, and Figs. 7a and 7b are sectional views taken along the section lines E–E' and F–F' of FIG. 6, respectively.

In this primary embodiment, a contact hole 15 is formed in an intersecting section, or an overlap section of the structure where a lower interconnection layer 12 intersects an upper interconnection layer 14. The lower and upper interconnection layers 12 and 14 are connected to each other through the contact hole 15. Here, the lower interconnection layer 12 has no enlarged portion at the intersecting section, while the upper interconnection layer 14 has an enlarged portion at that intersecting section where it intersects the lower interconnection layer 12. In addition, the contact hole 15 has such rectangular plan section that its longitudinal side covers the intersecting section of the lower interconnection layer 12 and its width is less than that of the enlarged portion of the upper interconnection layer 14 but equal to that of the other section of that layer 14 as shown in FIGS. 7a and 7b.

In order to prepare this multilayer interconnection structure, the lower interconnection layer 12 is laid on a first insulating layer 11 deposited on a semiconductor substrate (not shown). A second insulating layer 13 is, thereafter, deposited on the surface of the first insulating layer 11 to cover the intersecting section of the lower interconnection layer 12. When deposition of the second insulating layer 13 on the first insulating layer 11 is accomplished, a part of the second insulating layer 13 is removed to expose the intersecting section of the lower interconnection layer 12 to the outside prior to preparation of the contact hole 15. After the contact hole 15 is formed on the exposed section of the lower interconnection layer 12, the upper interconnection layer 14 is laid on the contact hole 15 such that the upper interconnection layer 14 passes over the contact hole 15 and intersects the lower interconnection layer 12. The lower and upper interconnection layers 12 and 14 are thus connected to each other through the contact hole 15.

From the sectional views of FIGS. 7a and 7b, it is noted that the section of this primary embodiment taken along the section line E–E' of FIG. 6 is equal to that of the known structure of FIG. 2a, however, the section of the primary embodiment taken along the section line F–F' of FIG. 6 is different from the known structure. That is, the contact hole 15 is connected to the upper interconnection layer 14 and the longitudinal side of the contact hole 15 covers all of the intersecting section of the lower interconnection layer 12 as described above, so that the contact hole 15 is connected to the upper interconnection layer 12 as well as to the upper surface together with the both side surfaces of the lower interconnection layer 12. In this regard, the contact area of the upper interconnection layer 14 to the lower interconnection layer 12 is remarkably increased.

Figure 8:
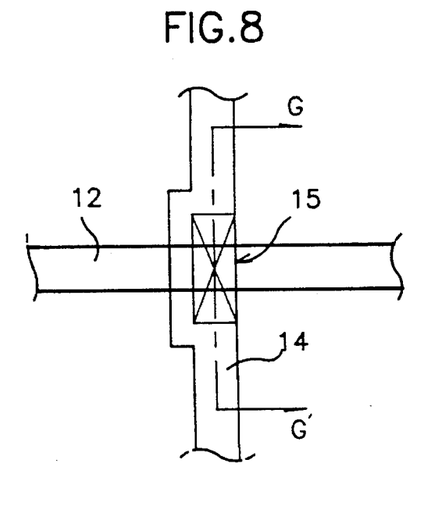
FIG. 8 is a plan view of a multilayer interconnection structure for a semiconductor device in accordance with a second alternate embodiment of the present invention.
Figure 9:
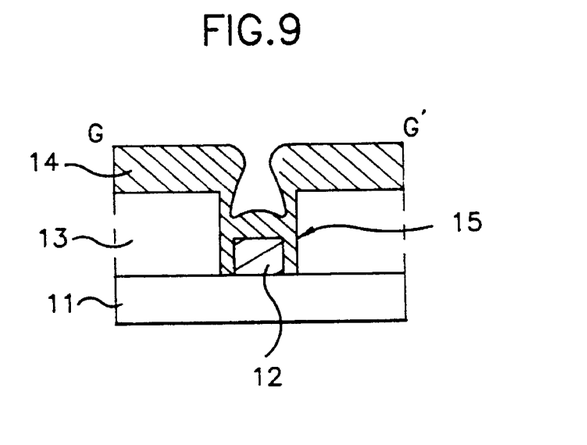
FIG. 9 is a sectional view of the second alternate embodiment taken along the section line G–G' of FIG. 8.
Figure 10:
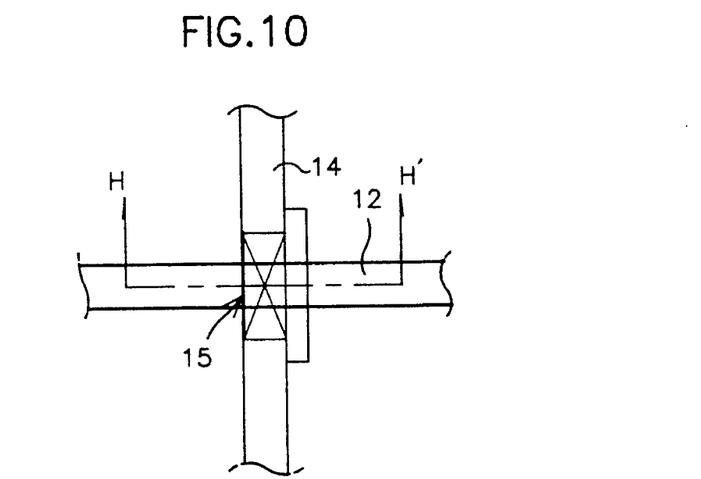
FIG. 10 is a plan view of a multilayer interconnection structure for a semiconductor device in accordance with a third alternate embodiment of the present invention.
Figure 11:
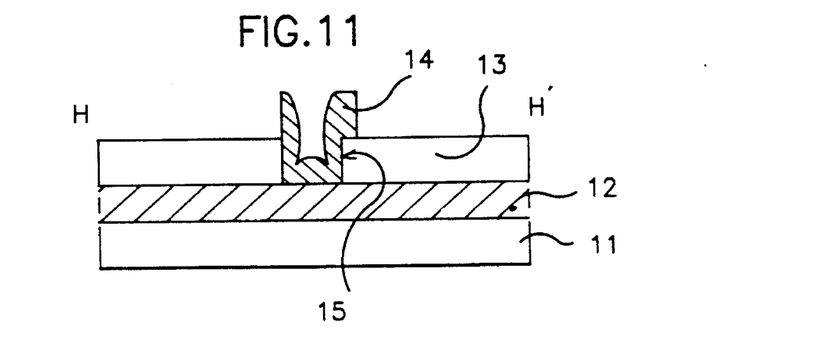
FIG. 11 is a sectional view of the third alternate embodiment taken along the section line H–H' of FIG. 10.

Turning to FIGS. 8 to 11, there are shown multilayer interconnection structures for a semiconductor device in accordance with second and third alternate embodiments of this invention. FIGS. 8 and 10 are plan views of the multilayer interconnection structures according to the second and third alternate embodiments, respectively. FIGS. 9 and 11 are sectional views of the structures taken along the section line G–G' of FIG. 8 and the section line H–H' of FIG. 10, respectively.

In the second and third alternate embodiments, the preparation method of and the general shape of each of the interconnection structures remain the same as in the primary embodiment, but the upper interconnection layer 14 is altered to have an enlarged portion at a part of the intersecting section where it intersects the lower interconnection layer 12. That is, the upper interconnection layer 14 has the enlarged portion at the right side or at the left side of the intersecting section.

In the same manner as described for the primary embodiment, the upper interconnection layer 14 of the interconnection structure according to the second or third embodiment is connected to the lower interconnection layer 12 through the contact hole 15. The longitudinal side of the contact hole 15 covers all of the intersecting section of the lower interconnection layer 12, so that the contact area of the upper interconnection layer 14 to the lower interconnection layer 12 through the contact hole 15 is remarkably increased.

Figure 12:
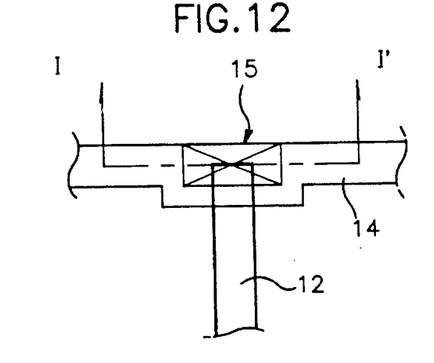
FIG. 12 is a plan view of a multilayer interconnection structure for a semiconductor device in accordance with a fourth alternate embodiment of the present invention.
Figure 13:
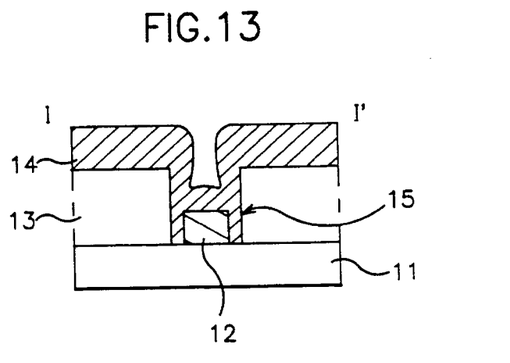
FIG. 13 is a sectional view of the fourth alternate embodiment taken along the section line I–I' of FIG. 12.

FIG. 12 is a plan view of a multilayer interconnection structure in accordance with a fourth alternate embodiment of this invention. FIG. 13 is a sectional view taken along the section line I–I' of FIG. 12.

In the fourth alternate embodiment, the preparation method of and the general shape of the interconnection structure remain the same as in the primary embodiment, but the upper interconnection layer 14 intersects a distal end of the lower interconnection layer 12.

Otherwise stated, the contact hole 15 of this fourth embodiment covers the distal end as well as both sides of the end of the lower interconnection layer 12. The upper interconnection layer 14 has the enlarged portion formed at its intersecting section and toward the side of the lower interconnection layer 12. In this regard, the contact hole 15 lets the upper surface of, both side surfaces of and distal end surface of the lower interconnection layer 12 be connected to the upper interconnection layer 14.

Hence, the structure according to the fourth embodiment remarkably increases the contact area of the lower and upper interconnection layers 12 and 14 through the contact hole 15 and reduces the area of the enlarged portion, thereby improving the integration degree of the semiconductor device.

Figure 14:
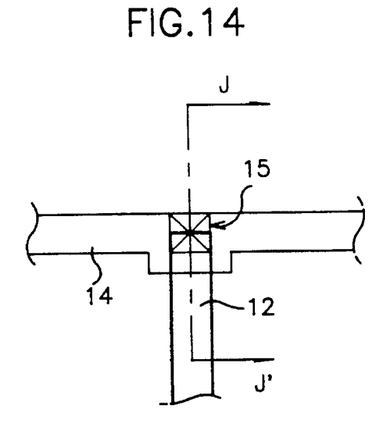
FIG. 14 is a plan view of a multilayer interconnection structure for a semiconductor device in accordance with a fifth alternate embodiment of the present invention.
Figure 15:
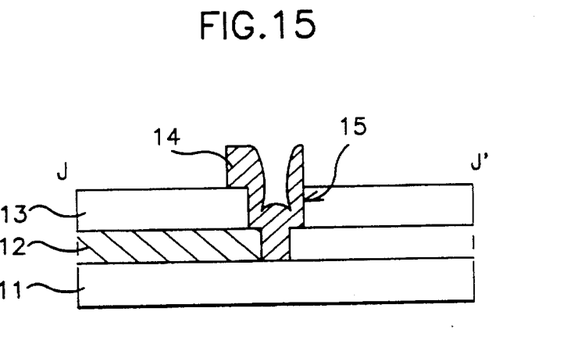
FIG. 15 is a sectional view of the fifth alternate embodiment taken along the section line J–J' of FIG. 14.
Figure 16:
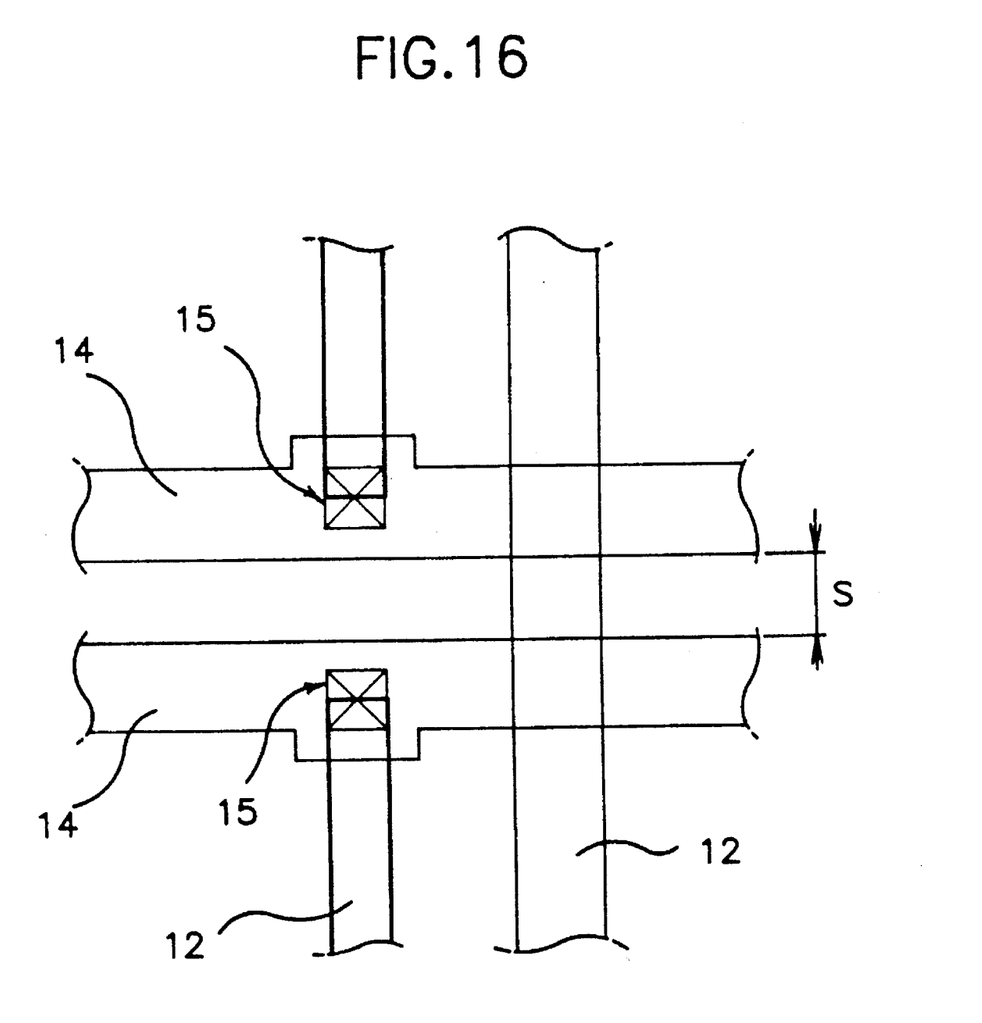
FIG. 16 is a plan view of a multilayer interconnection structure for a semiconductor device, representing the improved integration degree of the semiconductor device according to the present invention.

Turning to FIGS. 14 and 15, there is shown a multilayer interconnection structure in accordance with a fifth alternate embodiment of this invention. FIG. 14 shows in a plan view the interconnection structure, and FIG. 15 is a sectional view of the structure taken along the section line J–J' of FIG. 14.

In this fifth embodiment, the general shape of the interconnection structure remains the same as in the fourth embodiment, but the contact hole 15 is altered to cover only the distal end portion of the lower interconnection layer 12. In this regard, the upper interconnection layer 14 is connected to the upper surface of and the distal end surface of the lower interconnection layer 12, thereby increasing the contact area of the layers 12 and 14.

As described above, the multilayer interconnection structure of this invention increases the contact area of the upper and lower interconnection layer without reduction of the contact hole size, thereby eliminating a problem caused by increasing contact resistance.

In addition, the upper interconnection layer of this structure may have an enlarged portion at only a part of its intersecting section where it intersects the lower interconnection layer which has no enlarged portion. Thus, the interconnection interval is remarkably reduced and, as a result, the integration degree of the semiconductor device is remarkably improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multilayer interconnection structure for a semiconductor device, comprising:

a lower interconnection layer formed on a substrate, said lower interconnection layer having a predetermined constant width and a distal end portion, said distal end portion having an end surface, an upper surface, a lower surface and two side surfaces;

an insulating layer on said distal end portion and having a contact hole, said contact hole covering said end surface, said upper surface and both said side surfaces, said contact hole being consistent with said end surface; and an upper interconnection layer laid on said insulating layer such that it is connected to said lower interconnection layer through said contact hole, said upper interconnection layer being in contact with said upper surface, said end surface, and said side surfaces extending from said upper surface to said lower surface, of said distal end portion.

2. The multilayer interconnection structure according to claim 1, wherein said upper interconnection layer has an enlarged portion at a side of its section corresponding to said contact hole, said enlarged portion extending toward a longitudinal direction of said lower interconnection layer.

3. A multilayer interconnection structure for a semiconductor device, comprising:

a lower interconnection layer formed on a substrate, said lower interconnection layer having a predetermined constant width and an upper surface, a lower surface and two side surfaces;

an insulating layer on said lower interconnection layer and having a contact hole vertically placed on said lower interconnection layer, said contact hole having a width larger than said predetermined constant width of said lower interconnection layer and covering said upper surface and both said side surfaces of said lower interconnection layer; and an upper interconnection layer laid on said insulating layer such that it is connected to said lower interconnection layer through said contact hole, said upper interconnection layer being in contact with said upper surface and said side surfaces extending from said upper surface to said lower surface, of said lower interconnection layer, and said upper interconnection layer having an enlarged portion at only one side of its section corresponding to said contact hole, said enlarged portion extending toward a longitudinal direction of said lower interconnection layer.

* * * * *